United States Patent [19]

Seo et al.

[11] Patent Number: 5,723,371
[45] Date of Patent: Mar. 3, 1998

[54] METHOD FOR FABRICATING A THIN FILM TRANSISTOR HAVING A TAPER-ETCHED SEMICONDUCTOR FILM

[75] Inventors: Young-Kap Seo; Chi-Woo Kim; Ho-Chul Kang, all of Yongin-gun, Rep. of Korea

[73] Assignee: Samsung Electronics Co., Ltd., Suwon, Rep. of Korea

[21] Appl. No.: 517,878

[22] Filed: Aug. 23, 1995

[51] Int. Cl.[6] ................................................ H01L 21/84
[52] U.S. Cl. .......................... 438/158; 438/906; 438/978
[58] Field of Search .............................. 437/21, 40–41, 437/101; 438/158, 906, 978

[56] References Cited

U.S. PATENT DOCUMENTS

| 5,034,339 | 7/1991 | Tanaka et al. | 437/40 |
| 5,393,682 | 2/1995 | Liu | 437/41 |
| 5,441,905 | 8/1995 | Wu | 437/41 |
| 5,496,752 | 3/1996 | Nasu et al. | 437/41 |

Primary Examiner—John Niebling
Assistant Examiner—Richard A. Booth
Attorney, Agent, or Firm—Cushman Darby & Cushman Intellectual Property Group of Pillsbury Madison & Sutro LLP

[57] ABSTRACT

A method for fabricating a thin film transistor having a taper-etched semiconductor film includes the steps of forming a gate electrode on a bare substrate; forming an insulating film on the gate electrode;p forming a semiconductor film by forming an amorphous silicon film layer on the insulating film and forming an $N^+$ amorphous silicon film on the amorphous silicon film layer, descumming photoresist residue from the semiconductor film by using a specified gas and taper etching a part of the semiconductor film, which is uncoated with the photoresist, by using HCl and $SF_6$, to form a gentle slope in the etching profile resulting from overetching.

3 Claims, 2 Drawing Sheets

METHOD FOR FABRICATING A THIN FILM TRANSISTOR HAVING A TAPER-ETCHED SEMICONDUCTOR FILM

BACKGROUND OF THE INVENTION

The present invention relates to a method for fabricating a thin film transistor having a taper-etched semiconductor film. More particularly the present invention relates to a method for fabricating a taper-etched semiconductor film without forming an open line during the deposition process of a metal layer on the semiconductor film. The process uses $SF_6$ and HCl as the etching gas, followed by removing the undeveloped photoresist residue from the semiconductor film using $CF_4$ and $O_2$. The process includes forming an amorphous silicon film and an $N^+$ amorphous silicon film.

DESCRIPTION OF THE PRIOR ART

The typical method of fabricating a thin film transistor, as shown in FIG. 1, generally comprises the steps of forming gate electrode 2 on bare glass substrate 1; depositing gate insulating film 3 on gate electrode 1; forming semiconductor film 6 by depositing amorphous silicon film 4 and $N^+$ amorphous silicon film 5 sequentially; and forming source and drain electrodes 7a, 7b by depositing metal layers on semiconductor film 6.

Such a thin film transistor, however, has some disadvantages. First, there is the possibility of forming an uneven etching surface, during the etching process, due to silicon residue on the insulating film underneath semiconductor film 6. In addition, an open metal layer on semiconductor film 6 may occur during the depositing of metal layers 7a and 7b, because the etched amorphous silicon film 4 and $N^+$ amorphous silicon film 5 have vertical profiles.

Further, in etching semiconductor film 6, the lower and upper amorphous silicon films 4, 5 are etched at the same rate of time, and thus a vertical profile of the etched semiconductor is produced.

Accordingly, a process of removing silicon residue using $O_2$ gas may be employed prior to the etching process, so as not to form an uneven etching surface during the etching process. In such a process, however, the C component of the photoresist reacts with $O_2$, and thus a compound of C and $O_2$ is formed on the surface of the patterned semiconductor film. Some amount of this compound still remains even after the process of eliminating the photoresist.

The above-mentioned film can be processed in a buffered oxide etching BOE solution for abut one minute to remove the C and $O_2$ compound, the insulating film deteriorates. This leads to another disadvantage in that the source and drain electrodes are electrically connected to the gate electrode.

SUMMARY OF THE INVENTION

It is an object of the present invention to solve the above-mentioned disadvantages of conventionally fabricated thin film transistors.

Another object of the present invention is t provide a method of manufacturing a thin film transistor having a taper-etched semiconductor film, which method is capable of depositing metal layers on the semiconductor film easily.

the present invention includes the steps of forming a gate electrode on a bare substrate; forming an insulating film on the gate electrode; forming a semiconductor film by forming an amorphous silicon film layer on the insulating film and forming an $N^+$ amorphous silicon film on the amorphous silicon film layer; descumming a photoresist residue from the semiconductor film using a specified gas selectively taper etching apart of the semiconductor film uncoated with the photoresist using HCl and $SF_6$, except for the insulating film, to form a gentle slope in the etching profile resulting from overetching; and forming a source electrode and a drain electrode on the semiconductor film.

DETAILED DESCRIPTION OF THE PREFERRED EMBODIMENTS

A preferred embodiment of the present invention will be described below with reference to the accompanying drawings.

FIGS. 2A to 2E illustrate steps in the manufacture of a thin film transistor according to the present invention.

Figure 1:
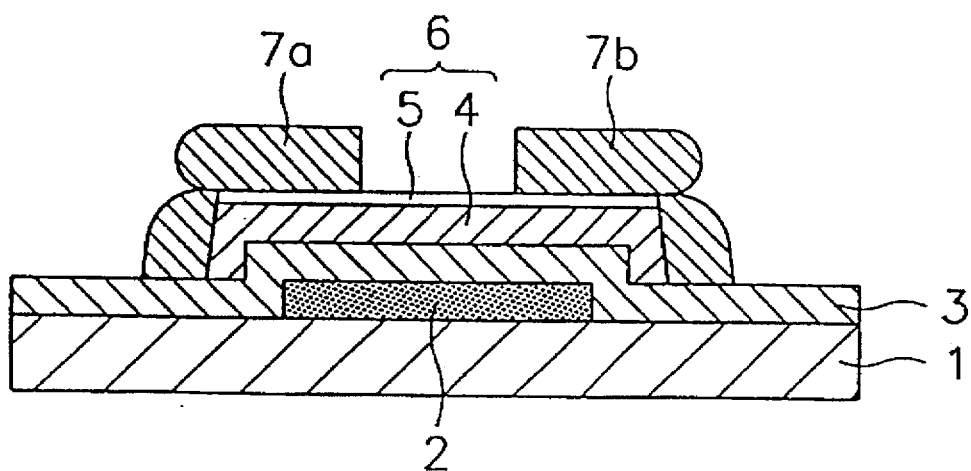
FIG. 1 is a cross-sectional schematic view of a typical prior art thin film transistor.
Figure 2A:
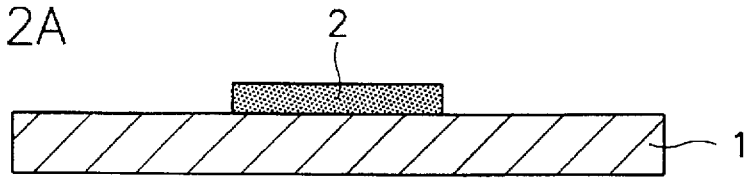
FIGS. 2A to 2E are cross-sectional views showing the successive steps in the process for producing a thin film transistor in accordance with the present invention.
Figure 2B:
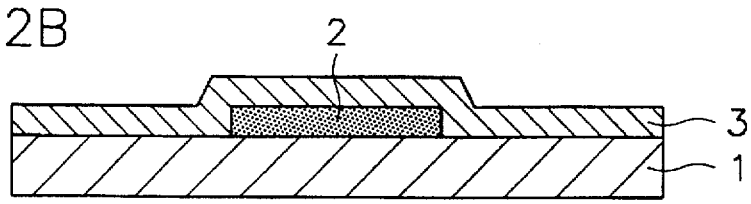

The process beings with the formation of gate electrode 2 on bare glass substrate 1 as shown in FIG. 2A. Insulating film 3 is then formed on gate electrode 2 and substrate 1 as shown in FIG. 2B.

Figure 2C:
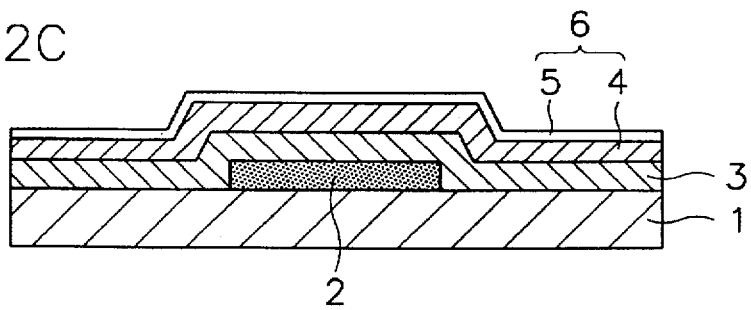
Figure 2D:
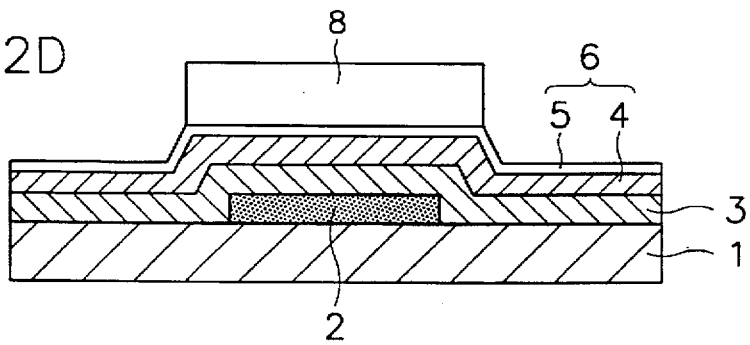

Subsequently, as shown in FIG. 2C, amorphous silicon film 4 and $N^+$ amorphous silicon film 5 are formed successively on insulating film 3 by chemical vapor deposition (CVD). Thereafter, as shown in FIG. 2D, the step of patterning semiconductor film 6, which includes film layers 4 and 5, is followed using photoresist 8.

The thus-formed semiconductor film 6, constructed by film layers 4 and 5, passes through the next step of scumming a residue of photoresist 8 therefrom using a specified gas which is capable of removing only the residue of photoresist 8 without deteriorating the semiconductor film 6, Here, the specified gas is a compound of $O_2$ and $CF_4$, and it is preferable to set the ratio of the two components in such a manner that $O_2$ accounts for a higher ration that $CF_4$. In particular, the most suitable compound ratio is 200 ($O_2$) to 1($CF_4$).

Figure 2E:
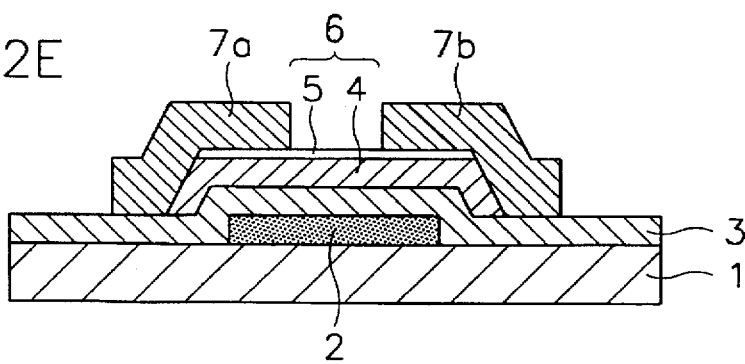

Next, as shown in FIG. 2E, taper-etching is carried out using a specified gas which is capable of etching semiconductor film 6, including film layers 4 and 5, but not insulating film 3. In other words, in this step, the part of semiconductor film 6 uncoated with photoresist is etched to expose insulating film 3. at this time, the etching profile which results has a gentle slope. It is preferable to use a compound of HCl and $SF_6$ as the specified gas in this step, preferably at a same ratio. It should be noted, however, that if HCl is used in excess by a predetermined amount, further etching stops undesirably and deposition is carried out.

Subsequently, source electrode 7a and drain electrode 7b are formed on semiconductor film 6, as shown in FIG. 2E.

What is claimed is:

1. A method for fabricating a thin film transistor having a taper-etched semiconductor film comprising:

forming a gate electrode on a bare substrate;

forming an insulating film on the gate electrode;

forming a semiconductor film by forming an amorphous silicon film layer on the insulating film and forming an $N^+$ amorphous silicon film on the amorphous silicon film layer;

depositing and patterning photoresist on said $N^+$ amorphous silicon film;

descumming photoresist residue from said semiconductor film using a first gas of $O_2$ and $CF_4$; and taper etching said semiconductor film with the remaining photoresist as a mask using a second gas of HCl and $SF_6$, to form a slope in the etching profile resulting from overetching.

2. The method of claim 1, in which:

a compound of the first gas contains more $O_2$ than $CF_4$.

3. The method of claim 1, in which:

a compound of the second gas contains the same ratio of HCl and $SF_6$.

* * * * *

UNITED STATES PATENT AND TRADEMARK OFFICE
CERTIFICATE OF CORRECTION

PATENT NO. : 5,723,371
DATED : March 3, 1998
INVENTOR(S) : SEO et al.

It is certified that error appears in the above-identified patent and that said Letters Patent is hereby corrected as shown below:

TITLE PAGE:

Please insert:

-- [30] Foreign Application Priority Data

August 23, 1994   [KR]  Rep. of Korea...... 94-20769

August 23, 1995   [KR]  Rep. of Korea...... 95-26039 --

Signed and Sealed this

Sixteenth Day of March, 1999

Attest:

Attesting Officer

Q. TODD DICKINSON

Acting Commissioner of Patents and Trademarks